(12) United States Patent
Kapusta et al.

(10) Patent No.: US 7,932,765 B2
(45) Date of Patent: Apr. 26, 2011

(54) DIGITAL DELAY LINES

(75) Inventors: Ronald A. Kapusta, Waltham, MA (US); Doris Lin, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 83 days.

(21) Appl. No.: 12/536,285

(22) Filed: Aug. 5, 2009

(65) Prior Publication Data

US 2010/0327934 A1 Dec. 30, 2010

Related U.S. Application Data

(60) Provisional application No. 61/220,270, filed on Jun. 25, 2009.

(51) Int. Cl.
*H03H 11/26* (2006.01)

(52) U.S. Cl. .................................... 327/269; 327/270

(58) Field of Classification Search .......... 327/269–271, 327/272, 276–278, 284, 285
See application file for complete search history.

(56) References Cited

U.S. PATENT DOCUMENTS

| | | | | |
|---|---|---|---|---|
| 5,355,037 | A | * | 10/1994 | Andresen et al. ............. 327/158 |
| 7,119,596 | B2 | * | 10/2006 | Kong et al. ................... 327/261 |
| 7,205,803 | B2 | * | 4/2007 | Chung et al. ................. 327/158 |
| 2005/0285653 | A1 | | 12/2005 | Chung et al. |
| 2006/0267648 | A1 | | 11/2006 | Kwak |
| 2008/0068060 | A1 | | 3/2008 | Hui et al. |

OTHER PUBLICATIONS

PCT International Search Report and Written Opinion mailed on Jul. 28, 2010, for PCT/US2010/37208.

* cited by examiner

*Primary Examiner* — Hai L Nguyen
(74) *Attorney, Agent, or Firm* — Kenyon & Kenyon LLP

(57) ABSTRACT

Some embodiments provide real-time variable delays in a delay line. In some of these embodiments, the real-time variable delays may be enable without producing clock glitches. In an embodiment, delay cells in a delay line may be coupled together in a chain to form a lattice of inverters providing different paths of signal propagation. Each path may have a different number of inverters; each inverter adding a known processing time associated with the signal inversion process. In some embodiments, an input signal may be propagated in an inverted or non-inverted form to the inputs of multiple inverters in the lattice, including the inputs of inverters through which the input signal does not propagate. A desired delay time may be obtained in an embodiment by selecting a path containing a desired number and configuration of inverters. The path may be selected in an embodiment using switchably enabled inverters.

28 Claims, 7 Drawing Sheets

High TS Inverter 12

In 26     Out 27

Control 28

| Control 28 | In 26 | Out 27 |
|---|---|---|
| 0 | 0 | Z |
| 0 | 1 | Z |
| 1 | 0 | 1 |
| 1 | 1 | 0 |

Low TS Inverter 13

In 36     Out 37

Control 38

| Control 38 | In 36 | Out 37 |
|---|---|---|
| 0 | 0 | 1 |
| 0 | 1 | 0 |
| 1 | 0 | Z |
| 1 | 1 | Z |

DIGITAL DELAY LINES

REFERENCE TO RELATED APPLICATIONS

This application claims priority to U.S. Provisional Application No. 61/220,270, filed Jun. 25, 2009, the contents of which are incorporated herein by reference in its entirety.

BACKGROUND

Digital delay lines are commonly used to "delay" or prevent a signal from arriving at an output until a predetermined time has elapsed. Each delay line typically contain several delay cells, with each of the delay cells having a fixed delay time. Delay time in delay lines is commonly changed by increasing or decreasing the number of delay cells that a signal passes through; as the number of delay cells increase, the overall delay time will increase, and vice versa.

Delay cells in delay lines have been connected in various ways. In some situations, delay cells have been connected in series, with an output for each delay cell coupled to a multiplexer, logic gates, or flip-flops, to select the output best synchronized with a reference clock. In other situations, a delay line may have single clock output, a digital control signal, and multiple delay cells connected in a lattice formation. In these situations, the multiple delay cells connected in a lattice formation are often NAND gates, and the digital control signal enables or disables different NAND gates in the lattice.

FIG. 1A shows an existing exemplary NAND gated-based delay line. The delay cells 10-N0 may be provided in a "lattice" configuration in which each delay cell provide a pair of selectable signal paths, each of which include various NAND gate-based delay elements. Each intermediate delay cell (for example, cell 20) may be connected to pair of neighboring cells via respective input/output terminals (IN-A/OUT-A1&A2 and IN-B1&B2/OUT-B). An input signal is presented from a "lower" neighboring cell 10 to the cell 20 at a first input terminal IN-A. The input signal is then coupled to a first input of NAND gates 27 & 28. Control signal SEL2 and/or inverted control signal $\overline{SEL2}$ may be coupled to the second input of these NAND gates 27 & 28. The output of NAND gate 27 may be coupled to the output terminal OUT-B of the delay cell 20, which may be coupled to an input terminal of the next delay cell. The output of NAND gate 28 may be coupled to a first output terminal OUT-A1, which may be connected a first input of a NAND gate in a preceding delay cell, such as NAND gate 19. A third NAND gate 19 may have its input terminals coupled to input terminals IN-B1&B2 of the delay cell, which may in turn be coupled to the corresponding outputs of the next delay cell. The output of the third NAND gate 19 may be coupled to output terminal OUT-A2, which may be connected a second input of a NAND gate in a preceding delay cell, such as NAND gate 19. An input signal 15 may be coupled to an input terminal of a first delay, an output signal 45 may be coupled to the output of NAND gate 55 while the inputs of the NAND gate 55 may be coupled to corresponding output terminals of delay cell 10. An inverter 25 may be coupled between the output of NAND gate N7 and the input of the NAND gate N9 in the last delay cell N0.

By adjusting control signal values SEL1-SELN the path of signal propagation can be changed. Enabling additional NAND gates, such as NAND gates 17 and 27, while disabling others, such as NAND gates 18 and 28, will redirect the signal further down the lattice through additional NAND gates; each additional NAND gate that the signal passes through further delays the signal, increasing the total delay. Similarly, disabling these NAND gates in the lattice may reduce the number of NAND gates that the signal passes through, thereby reducing the delay.

One issue with using NAND gates as delay cells is that when a NAND gate is disabled and not used in the signal delay path, the NAND gate does not store any signal information. Because the NAND gate does not store any signal information, when a disabled NAND gate is later enabled, there may be a signal inconsistency and/or glitch between the time the NAND gate is first enabled and the time the NAND gate begins processing the signal.

There is a need for a configurable delay cell system where delay cells can be enabled and disabled without causing signal inconsistencies or glitches.

DETAILED DESCRIPTION

Embodiments of the present invention provide a delay line that may include a plurality of delay cells, each comprising a plurality of delay elements. The delay cells may be coupled in a lattice formation, with selectable signal paths. Some of the inverters may be provided as tri-state inverters. During operation, delay cells may be added or removed from a signal path extending from the delay line's input to its output, which controls an amount of delay imposed upon an input signal. The delay line is configured to ensure that a delay cell receives "live" data reflecting a present state of an input signal before it is added to the signal path, which protects the delay line against glitches seen in other systems.

Figure 1A:
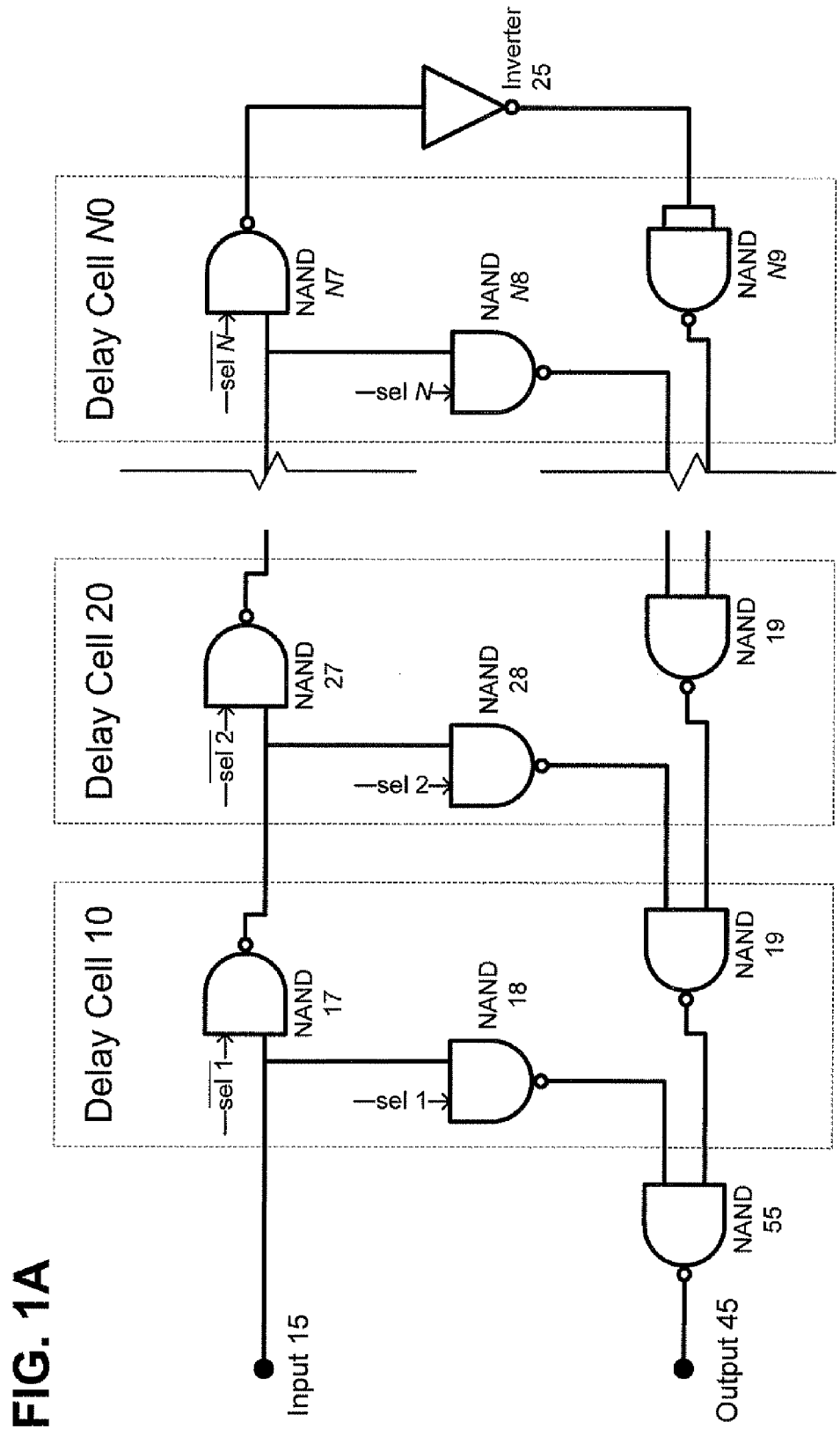
FIG. 1A shows an existing exemplary NAND gated-based delay line.
Figure 1B:
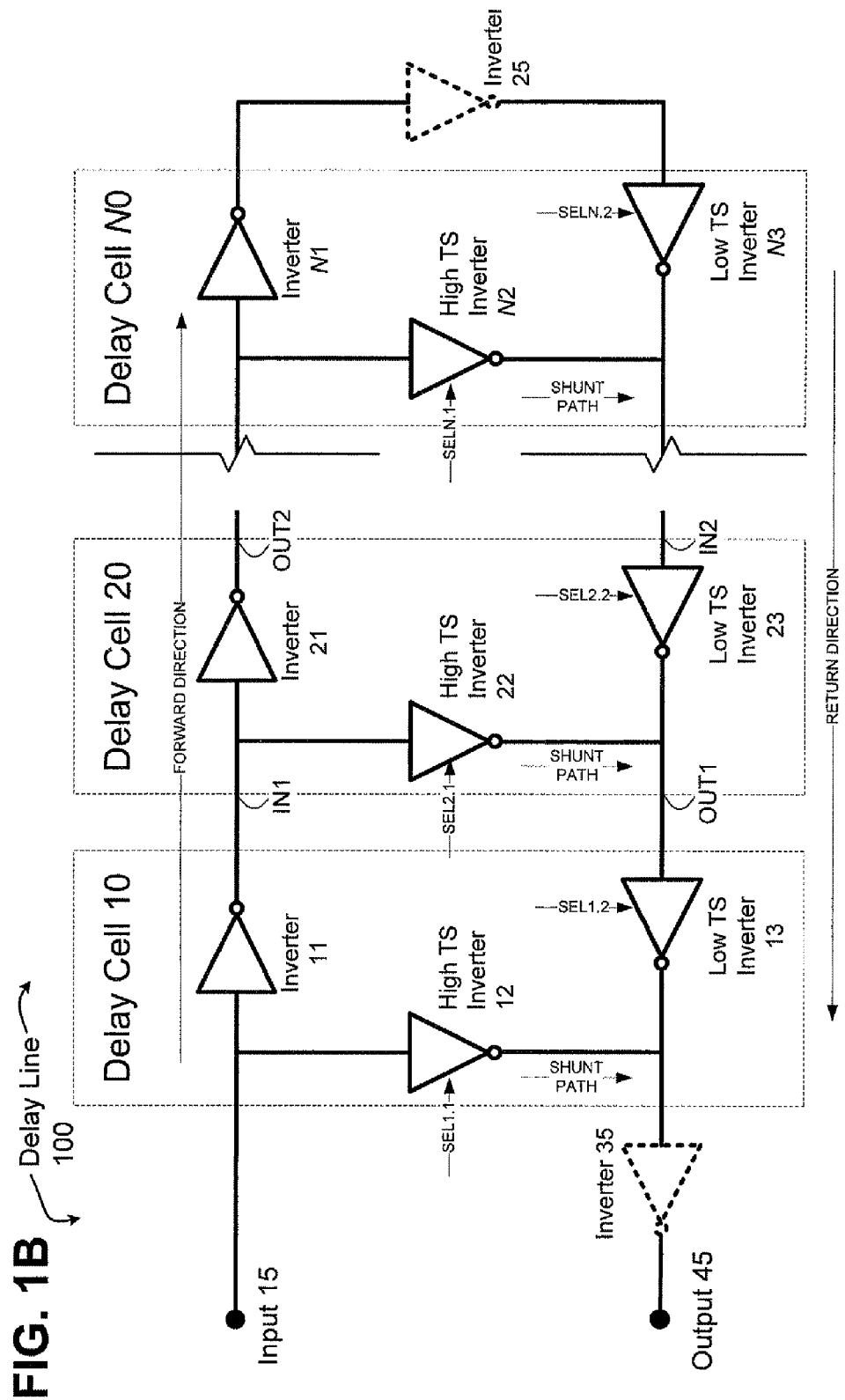
FIG. 1B shows an embodiment of the invention including a lattice of N delay cells.

FIG. 1B shows a delay line 100, according to an embodiment of the invention, including a plurality of N delay cells 10-N0. The delay cells 10-N0 may be provided in a "lattice" configuration in which each delay cell provide a pair of selectable signal paths, each of which include various delay elements. Each intermediate delay cell (for example, cell 20) may be connected to pair of neighboring cells via respective input/output terminals (IN1/OUT2 and IN2/OUT2). An input signal is presented from a "lower" neighboring cell 10 to the cell 20 at a first input terminal IN1. A first signal path (called the shunt path) within the cell 20 may extend from the first input terminal IN1 to the output terminal connected to the lower neighboring stage OUT1. A second signal path within the cell may extend from the first input terminal IN1 to a second output terminal OUT2 that propagates the input signal to a 'higher' neighboring cell. If the signal propagates to the high neighboring cell, the signal will be returned from the higher cell at the second input terminal IN2, which is electrically connected to the first output terminal OUT1. Control signals SEL1.1, SEL1.2, . . . SELN.2 dynamically control signal propagation through the delay line 100. An input signal provided at terminal 15 may propagate through a selected number of delay cells in a forward direction until it reaches a delay cell (say, cell 20) that is switched to the shunt path. The signal thereafter may propagate back to an output terminal 45. By dynamically controlling the number of delay cells through which the input signal propagates from the input terminal 15 to the output terminal 45, a system may dynamically adjust a delay imposed on signals input to the delay line 100.

In the embodiment illustrated in FIG. 1B, an input signal 15 may be coupled to the input of a first delay cell 10, which may be coupled to the inputs of an inverter 11 and a high active control tri-state inverter 12 of the first delay cell 10. The output of inverter 11 may be connected to the input of the next delay cell 20, which may be coupled to the inputs of an inverter 21 and a high active control tri-state inverter 22 of the next delay cell 20. The output of the high active control tri-state inverter 12 may be coupled to the output of a low active control tri-state inverter 13 and the output of the delay 10, which may be coupled to the input of an inverter 35. The output of inverter may be coupled to an output signal 45.

The input of the low active control tri-state inverter 13 may be coupled to the output of the next delay cell 20, which may be coupled to the output of the high active control tri-state inverter 22 and the output of a low active control tri-state inverter 23 of the next delay cell 20. In an embodiment, the described connectivity between delay cells may continue as additional delay cells are added. Thus, if a third delay cell is added, the delay cell may have a similar structure to delay cells 10 and/or 20, with the input of the third delay cell coupled to the output of inverter 21 and the output coupled to the input of low active control tri-state inverter 23, and so on.

In an embodiment, the input of the N-th and last delay cell N0 may be coupled to the output of the inverter of the prior (N−1) delay cell. The input of the last delay cell N0 may also be coupled to the inputs of an inverter N1 and a high active control tri-state inverter N2. The output of inverter N1 may be coupled to the input of an inverter 25 while the output of the inverter 25 may be coupled to the input of a low state control tri-state inverter N3. The output of the low state control tri-state inverter N3 may be coupled to the output of the high active control tri-state inverter N2 and the input of a low state control tri-state inverter of the prior (N−1) delay cell.

In an embodiment, each of the tri-state inverters may be controlled through a tap select, which determines whether the tri-state inverter is active or inactive. In a digital delay with N delay cells, with each delay cell comprising two tri-state inverters, there will be 2/N tap selects. In embodiments with different numbers of tri-state inverters, there may be a different number of tap selects. In an embodiment, each of the tri-state inverters may be enabled or disabled through a thermometer code tap select, which may comprise one bit for controlling each inverter or tap. The thermometer code may then incremented to activate additional delay cells and further delay signal, or decremented to deactivate delay cells and reduce signal delay.

In an embodiment, each inverter in the delay line 100 may receive at its input either the inverted or the non-inverted signal from input 15, as long as at least one of the tri-state inverters 12 and 13, 22 and 23, to N2 and N3, is active in each delay cell 10, 20, and N0, regardless of the path a signal takes to get to output 45 from input 15. In an embodiment, if inverters 11, 21, to N1 and inverter 25 are standard, non-tristate inverters, they will each invert and propagate the input signal 15 to each high tri-state inverter 12, 22, to N2, and to the low tri-state inverter N3 in the last delay cell N0. Thus, each of these inverters will receive at their input either the inverted or non-inverted input signal 15. Moreover, since at least one of the tri-state inverters in each delay cell is active, each of the low tri-state inverters 13, 23, to (N−1)3, and inverter 35, will also receive at their inputs either the inverted or the non-inverted input signal 15 from the output of either the high or low tri-state converter in an adjacent delay cell.

In some embodiments, some or all of the non-tri-state inverters, such as inverters 11, 21, to N1, may be replace with tri-state inverters. Replacing these inverters with tri-state inverters may enable increased power efficiency, by, for example, deactivating certain inverters in delay cells that are not part of the signal path from input 15 to output 45 to prevent current from flowing to the unused delay cells. However, while tri-state inverters may be used to prevent current from flowing to certain unused delay cells, it may be desirable in some embodiments to have either the inverted or non-inverted input signal 15 flow into the inputs of at least some of the inverters in one or more unused delay cells. This may be desirable in situations where the signal path is changed and redirected into one or more previously unused delay cells, so that when the inverters in these previously unused delay cells are activated, the activation will coincide with the input data and the risk of glitches may be avoided.

In the embodiment shown in FIG. 1B, inverter 25 is included to ensure that the input signal 15 is propagated to the inverters in the return direction, such as inverter N3, while inverter 35 is included to ensure that each signal path between input 15 and output 45 has an even number of inverters, thereby ensuring that the signal at input 15 will be replicated at output 45. In some instances, it may be acceptable or desirable for the signal at output 45 to be inverted. In these instances, inverter 35 may be removed from the circuit. In other embodiments, inverter 35 may be replaced, relocated, or supplemented with other inverters in other locations of the delay line 100, such as in one or more delay cells 10, 20, to N0, to ensure that the signal at output 45 replicates the signal at input 15.

Figure 2:
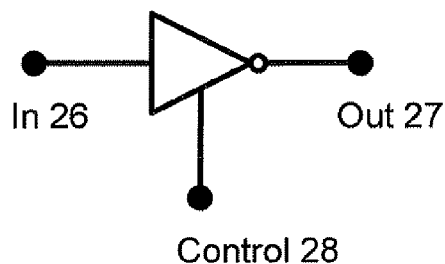
FIG. 2 shows a truth table for high and low active control tri-state inverters in an embodiment.
Figure 2:
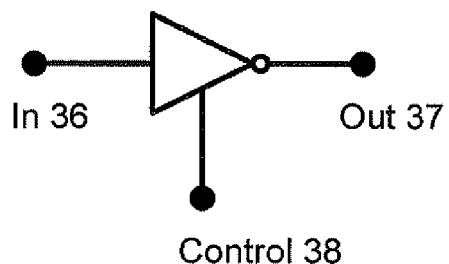

FIG. 2 shows a truth table in an embodiment, for high and low active control tri-state inverters, such as high active control tri-state inverters 12, 22, and N2, and low active control tri-state inverters 13, 23, and N3. In an embodiment, when the control bit 28 of a high active control tri-state inverter 12 is 0, the inverter is inactive and outputs 27 a high impedance Z; when the control bit is 1, the inverter inverts the input signal 26. The reverse may be true for the low active control tri-state inverter 13; when the control bit 38 is 0, the inverter outputs 37 an inverted input signal 36 and when the control bit 38 is 1, the inverter outputs 37 a high impedance Z. In some embodiments, a high impedance output Z may mean that no current flows at the output of the inverter.

Figure 3:
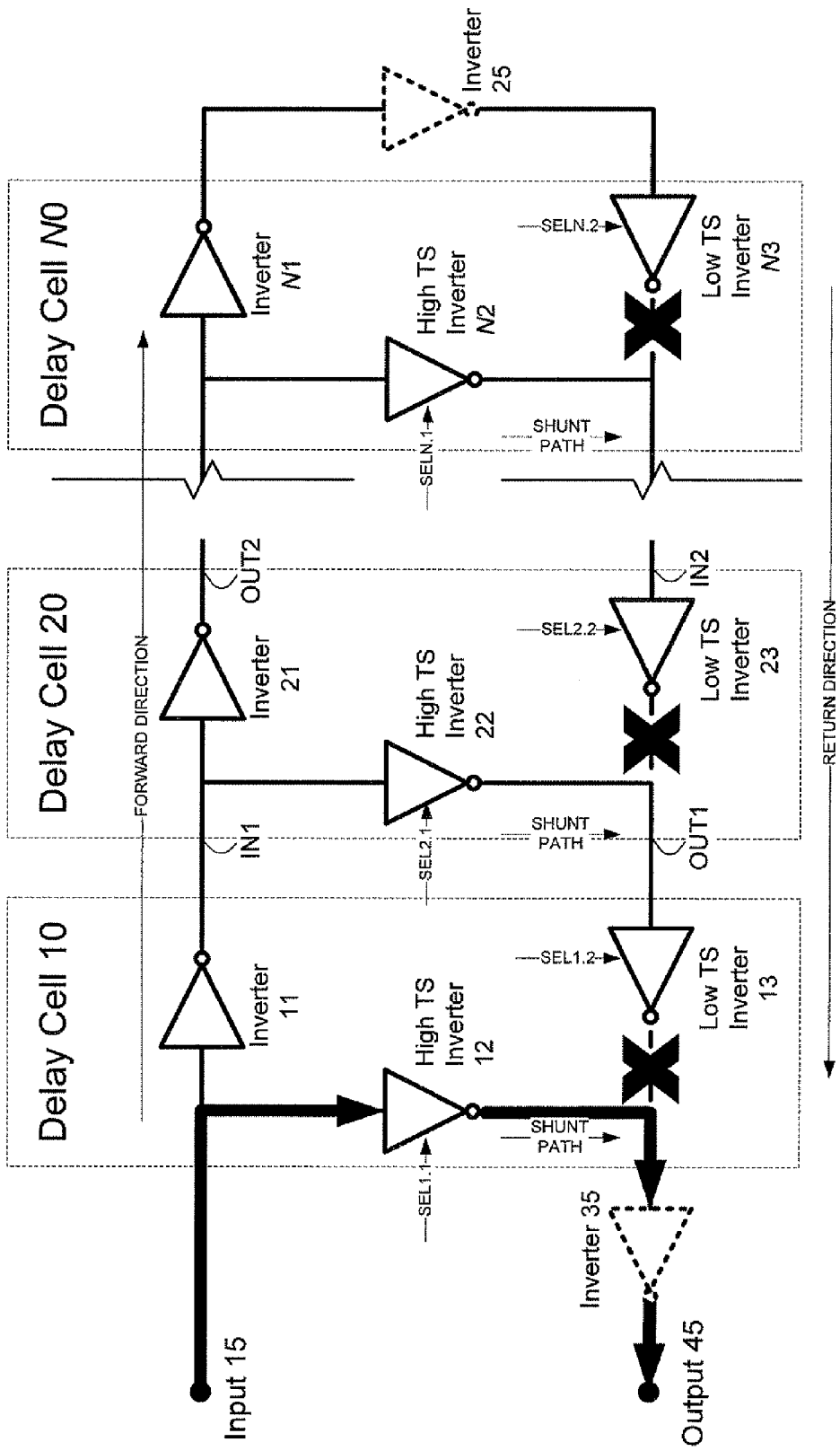
FIG. 3 shows a first configuration of delay line embodiment comprising two delay cells.

FIG. 3 shows exemplary operation of the delay line of FIG. 1B. In this example, the control bits of the tri-state inverters 12 and 13, 22 and 23, N2 and N3 are set to 1. As shown in the truth table of FIG. 2, when the control bit for low active control inverters 13, 23, and N3 are set to 1, these inverters 13, 23, and N3 output a high impedance Z, resulting in no effective current flows at the output of the inverters, as indicated by the "X."

In this embodiment, the input signal 15 propagates in either its original form or in an inverted form to the input of each inverter. However, since the output of low active control inverter 13 is a high impendence Z, the second to Nth delay cells 20 to N0 are effectively not used, and the signal will only be delayed by the time it takes to pass through inverters 12 and 35. Moreover, since the signal will have passed through an even number of inverters, the digital signal will be returned to its original form.

Figure 4:
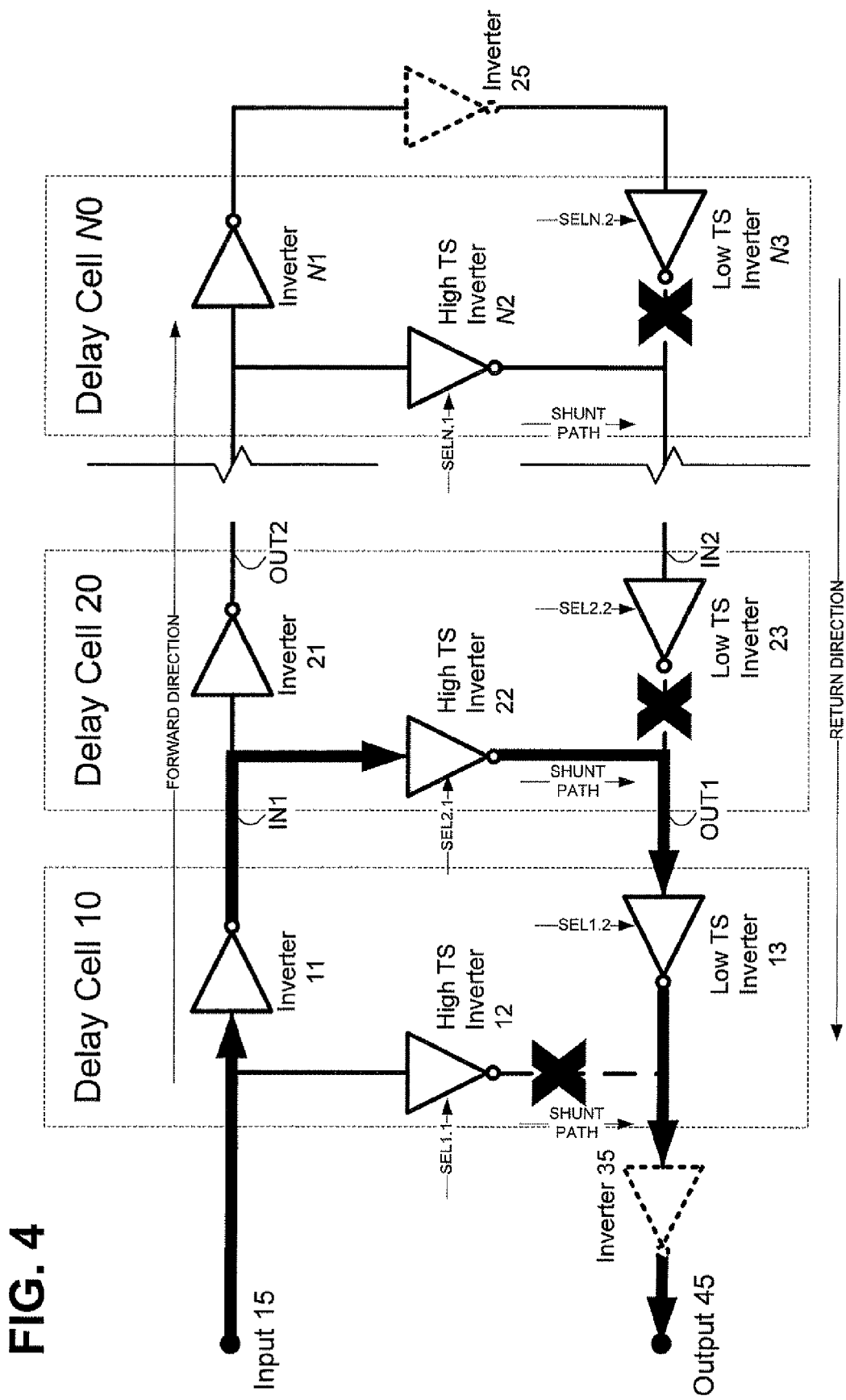
FIG. 4 shows a second configuration of delay line embodiment comprising two delay cells.

FIG. 4 shows exemplary operation when the delay line 100 is reconfigured to extend the delay path across two delay cells 10 and 20 in the same delay line embodiment shown in FIG. 3. In this embodiment, the control bits of the tri-state inverters 12 and 13 in the first delay cell 10 are switched and set to 0. According to the truth table of FIG. 2, a control bit of '0' for high active control inverter 12 indicates that inverter 12 will output a high impedance Z, resulting in no effective current flow at the output of the inverter, as indicated by the "X," while a control bit of '0' for low active control inverter 13, indicates that this inverter will output an inverted signal.

In this embodiment, the input signal 15 propagates in either its original form or in an inverted form to the input of each inverter, which is the same for the case shown in FIG. 3. However, since the output of both inverters 12 and 23 is a high impendence Z, the output signal 45 will only be delayed by the time it takes the input signal 15 to pass through inverters 11, 22, 13, and 35. Note also that since the signal in this case will have passed through an even number of inverters, the digital signal will be returned to its original form. In an embodiment, the total signal delay may be increased or decreased by changing the control bits in an adjacent delay cell from either a one to a zero to increase delay or a one to a zero to decrease delay.

Figure 5:
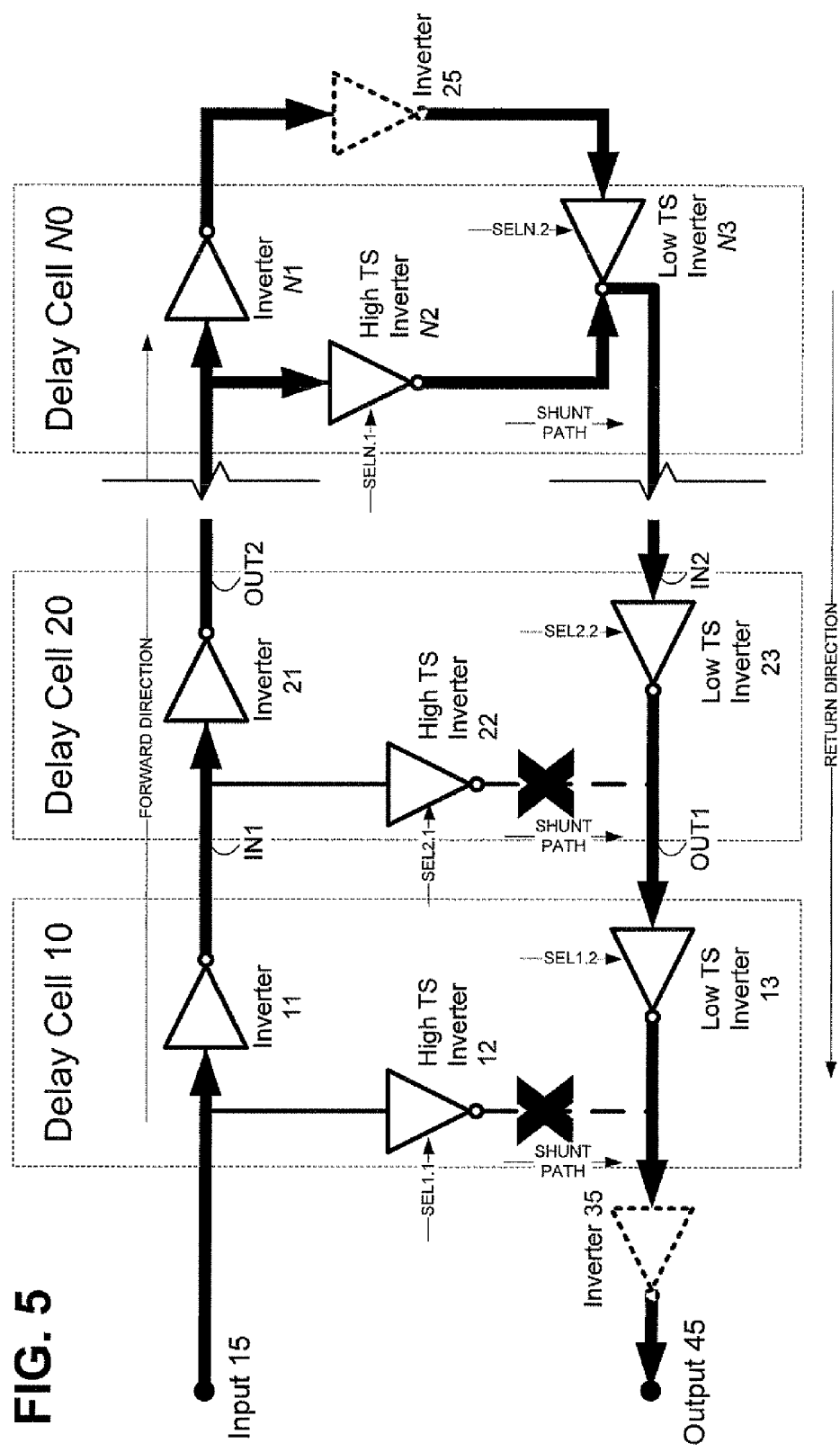
FIG. 5 shows a third configuration of delay line embodiment comprising two delay cells.

FIG. 5 shows exemplary operation of the delay line 100 in FIG. 1B when the control bits of all the tri-state inverters, except for N2 are switched to a '0', resulting in a delay interpolation. As shown in truth table of FIG. 2, a control bit of '0' for low active control inverter N3 indicates that the inverter N3 will output an inverted input signal, while a control bit of '1' for high active control inverter N2 indicates that the inverter N2 will also output an inverted input signal.

In this embodiment, inverters N2 and N3 may initially try to output different signal levels. For example, if the input to inverter N2 is changed a "0", the inverter N2 will attempt to output a voltage VDD corresponding to a "1". If, however, the input change to "0" is not processed by inverter N3 at the same time, inverter N3 may still be attempting to output a lower voltage VSS corresponding to "0" instead of the high voltage VDD corresponding to a "1." Until the inputs to inverters N2 and N3 reach a steady state, such as a "0" the voltage at the outputs of inverters N2 and N3 will be somewhere between VSS ("0") and VDD ("1") The exact voltage at the output of these inverters N2 and N3 will depend on the ratio between the PMOS device inside N2 pulling up and the NMOS device inside N3 pulling down.

Since the voltage at the output of inverter N3 is somewhere between VSS ("0") and VDD ("1"), it will take inverter N3 less time to reach a steady state voltage of either VSS ("0") or VDD ("1") once the input voltage of inverter N3 becomes synchronized with the input voltage of inverter N2. As shown in FIG. 5, once the input voltage of inverter N2 is changed to a "0", the input voltage to inverter N1 will also be changed to a "0." If the changes signal propagates through these inverters N1 and N2 at the same time, it will take roughly one additional inverter cycle for the signal to pass through inverter 25 to reach inverter N3. Thus, instead of the signal in FIG. 4 being delayed by six inverter cycles through inverters 11, 21, N2, 23, 13, and 35, the signal is now delayed by approximately seven inverter cycles for the extra time it takes the output of inverter N1 to pass through inverter 25, or conversely, the extra time it take the output of inverter N2 to pass through inverter N3. In different embodiments, the total delay time may be more finely adjusted by selecting the appropriate ratio of device sizes in N2 relative to N3.

Different variations and combination of delay cells may be used in different embodiments. For example, in some variations, some or all of the inverters may be tri-state inverters. Replacing some inverters, such as inverters 11, 21, and/or N1, with tri-state inverters may enable energy savings in some delay lines. These tri-state inverters may be configured to prevent an input signal from propagating to the inputs of some unused delay cells. In one embodiment, these tri-state inverters may be operative to restrict signal propagation from a first unused delay cell to the input of a second unused delay cell, or from a second unused delay cell to the input of a third cell. In other embodiments one or more of the low and/or high active control inverters may be replaced by different types of inverters, such as regular inverters and/or high or low active control inverters. In some embodiments, the taps, control bits, and/or tap select code may be adjusted according to configuration changes. By preventing signal propagation to unused delay cells, overall power consumption may be reduced by eliminating shoot-thru current as well as the charging and discharging of capacitances.

Figure 6:
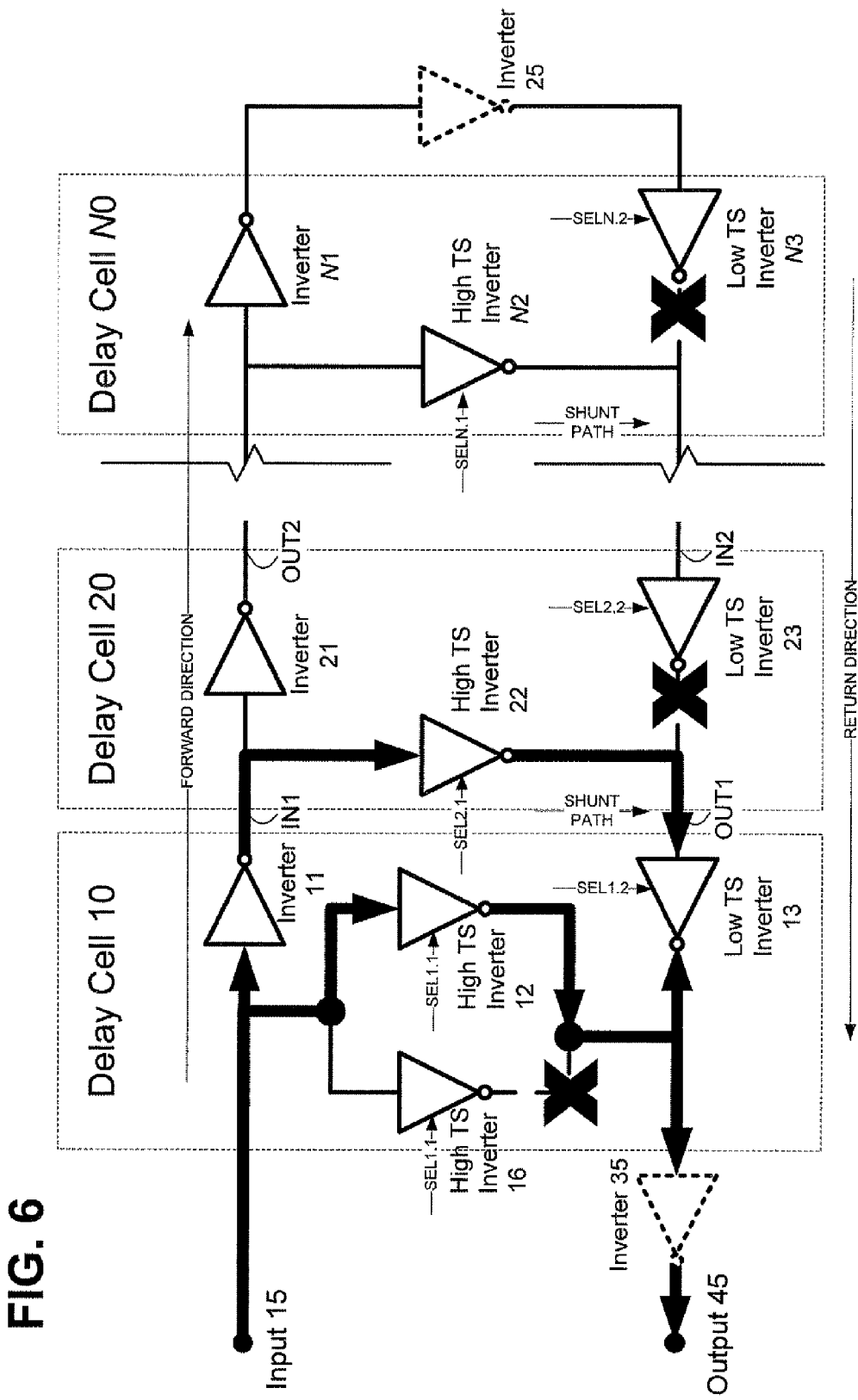
FIG. 6 shows a fourth configuration of delay line embodiment comprising two delay cells.

For example, FIG. 6 shows an embodiment comprising a variation of FIG. 3. In this variation, high active control inverter 16 is coupled in parallel with high active control inverter 12. Assuming that the control bits of the tri-state inverters 12 and 16 in the first delay cell are set to '1' and '0' respectively, the control bit of tri-state inverter 13 in the first delay cell is set to '0', and the control bits of the remaining tri-state inverters 22 and 23 to N2 and N3 in the remaining delay cell are set to '1', the truth table of FIG. 2 indicates a high impedance Z at the output of inverters 16 and 23 to N3. This means that the input signal 15 and current will flow through inverters 12, 11, 22, 13, and 35 to reach signal output 45.

In this embodiment, inverter 12 may initially try to output a different signal level than inverter 13. For example, if the input to inverter 12 is changed a "0" the inverter 12 will attempt to output a voltage VDD corresponding to a "1". If, however, the input change to "0" is not processed by inverter 13 at the same time, inverter 13 may still be attempting to output a lower voltage VSS corresponding to "0" instead of the high voltage VDD corresponding to a "1." Until the inputs to inverters 12 and 13 reach a steady state, such as a '0', the voltage at the outputs of inverters 12 and 13 will be somewhere between VSS ('0') and VDD ('1'). The exact voltage at the output of these inverters will depend on the ratio between the PMOS device inside inverter 12 pulling up and the NMOS device inside inverter 13 pulling down. As discussed in the preceding paragraphs, since the voltage at the output of inverter 13 is somewhere between VSS ("0") and VDD ("1"), it will take inverter 13 less time to reach a steady state voltage of either VSS ("0") or VDD ("1") once the input voltage of inverter N3 becomes synchronized with the input voltage of inverter N2.

In some embodiments, the size of the PMOS device in inverter 12 may vary from that of inverter 16. In these embodiments the ratio of MOS device sizes between inverter 12 and 13 and inverter 16 and 13 will also vary, resulting in different signal propagation times depending on whether the signal passes through inverter 12 or 16. Thus, further refinements to the total delay time can be made depending on whether inverter 12 or 16 is enabled. In different embodiments, additional inverters with varying MOS device sizes may added to the circuit and used as needed to further refine signal delay times.

Different inverter configuration in different embodiments may result in different signal processing times. By changing the transistor widths and/or coupling of the inverters, it is possible to obtain fractional inverter cycle processing times. By changing the number of delay cells and number of inverters in each delay cell through which a signal passes, it is possible to increase or decrease the number of inverter cycles and hence change the total processing time. Combining these two features may result in a vast range of signal delay times that may be customized in each signal delay line. In some instances, changes to signal delays times may be configured and/or altered through tap select code changes that control different tri-state inverters in the delay line.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments may refer high active control tri-state inverters, but other types of similar devices, such as low active control tri-state inverters or a standard inverter coupled to a high impedance switch may be used instead.

We claim:

1. A delay line comprising:
   a plurality of delay cells interconnected in a lattice configuration, the delay cells each supporting at least three propagation paths each of which traverse at least one delay element, wherein
      a first path propagates an input signal from a prior cell stage back to the prior cell stage,
      a second path propagates the input signal from the prior cell stage to a next cell stage, and
      a third path propagates a returned signal from the next cell stage to the prior cell stage, and
   a switch control to select a number of delay cells for inclusion in a configurable signal path extending from an input of the delay line to an output of the delay line, the configurable signal path including a signal path having a plurality of delay elements coupled in parallel to interpolate a delay,
   wherein at least one delay cell located outside but adjacent to the configurable signal path receives an active data signal based on an input signal to the delay line.

2. The delay line of claim 1, wherein all delay cells of the delay line receive respective active data signals based on the input signal to the delay line.

3. The delay line of claim 1, wherein a single delay cell located outside but adjacent to the configurable signal path receives the active data signal.

4. The delay line of claim 1, wherein the first path comprises a predetermined number of switchably enabled inverters.

5. The delay line of claim 1, wherein the first path comprises a plural number of switchably enabled inverters provided in parallel, with independent enablement control of at least two groups of the inverters.

6. The delay line of claim 1, wherein the third path comprises a predetermined number of switchably enabled inverters.

7. The delay line of claim 1, wherein the third path comprises a plural number of switchably enabled inverters provided in parallel, with independent enablement control of at least two groups of the inverters.

8. The delay line of claim 1, wherein the delay elements include tri-state inverters coupled to the switch control.

9. The delay line of claim 1, where the switch control comprises an interpolation setting enabling the first, second, and third propagation paths in a last cell stage of the delay line.

10. The delay line of claim 1, where the switch control comprises an interpolation setting enabling the first, second, and third propagation paths in a first cell stage and the first propagation path in the next cell stage to the first cell stage.

11. The delay line of claim 10, where the activation of the interpolation setting results in a propagation time between the first, second, and third propagation paths in a first cell stage and the first propagation path in the next cell stage that is between a first time for the signal to propagate through the first path in the first stage and a second time for the signal to propagate through the second path in the first stage, first path in the next stage, and third path in the first stage.

12. The delay line of claim 10, where the first cell stage is any cell stage in the delay line except the last cell stage.

13. A delay line comprising:
   a plurality of delay cells coupled in a chain, each delay cell including a plurality of inverters coupled in a lattice configuration where:
      at least one inverter is a switchably enabled inverter;
      the lattice provides a plurality of paths for signal propagation; and
      a control of the at least one switchably enabled inverter is configured to enable selection of a signal propagation path including a plurality of inverters coupled in parallel.

14. The delay line of claim 13, where an input signal is propagated to each inverter.

15. The delay line of claim 13, where an input signal is propagated to:
   the inverter(s) in the delay cell(s) in the selected path of signal propagation; and
   an inverter in an adjacent delay cell to the delay cell(s) in the selected path of signal propagation.

16. The delay line of claim 13, where a plurality of switchably enabled inverters are tri-state inverters.

17. The delay line of claim 13, where the selected path for signal propagation is switchable through the control while an input signal is being propagated through the delay line.

18. The delay line of claim 13, where a plurality of switchably enabled inverters are configured to enable an input signal to propagate in parallel through a plurality of paths for signal propagation to generate different interpolated delays.

19. The delay line of claim 18, where at least two of the plurality of paths for parallel signal propagation comprise different quantities of inverters.

20. A method comprising:
   in a lattice of delay stages, defining a signal path extending from a first delay stage, through a configurable number of the delay stages and returning to the first delay stage, the delay stages each including at least one delay element to impose a respective delay upon propagation of a signal input to the lattice at the first delay stage,
   inputting a signal from the signal path to a next delay stage that is outside the signal path, the input signal to the next delay stage being continuously derived from the signal input at the first delay stage, and
   providing a selectable signal path to propagate the continuously derived input signal in parallel through a plurality of delay elements to interpolate a delay,
   wherein, when the signal path is reconfigured to include the next delay stage, the next delay stage begins operation using the continuously derived input signal.

21. The method of claim 20, further comprising propagating the continuously derived input signal to a plurality of inverters in each delay stage.

22. The method of claim 20, further comprising propagating the continuously derived input signal to the inverter(s) in the defined signal path and an inverter in a delay stage adjacent to the defined signal path.

23. The method of claim 20, where the signal path is reconfigured to enable the continuously derived input signal to propagate through a plurality of inverters coupled in parallel.

24. The method of claim 20, where the signal path is reconfigured to enable the continuously derived input signal to propagate in parallel through a plurality of signal paths.

25. A delay line comprising:
an input coupled to a first delay cell;
an output coupled to the first delay cell; and
a plurality of delay cells coupled to each other in a chain, each delay cell comprising at least one inverter and a plurality of switchably enabled inverters, a first inverter propagating an input signal to an adjacent delay cell, a first switchably enabled inverter propagating an input signal to an output of the delay cell, and a second switchably enabled inverter propagating an output signal from an adjacent delay cell to the output of the delay cell, where at least one of the inverters is a tri-state inverter configured to enable a signal to propagate through a plurality of inverters coupled in parallel.

26. The delay line of claim 25, further comprising a control coupled to each switchably enabled inverter, the control disabling/enabling signal propagation at each tri-state inverter.

27. The delay line of claim 25, where the tri-state inventers are configured to enable an input signal to propagate in parallel through a plurality of paths for signal propagation.

28. The delay line of claim 25, where the plurality of inverters coupled in parallel are tri-state inverters.

* * * * *

UNITED STATES PATENT AND TRADEMARK OFFICE
CERTIFICATE OF CORRECTION

PATENT NO. : 7,932,765 B2  Page 1 of 1
APPLICATION NO. : 12/536285
DATED : April 26, 2011
INVENTOR(S) : Ronald A. Kapusta et al.

It is certified that error appears in the above-identified patent and that said Letters Patent is hereby corrected as shown below:

In column 8, line 35, change "inventers" to --inverters--

In column 8, line 40, change "inventers" to --inverters--

In column 10, line 11, change "inventers" to --inverters--

Signed and Sealed this
Fifteenth Day of January, 2013

David J. Kappos
*Director of the United States Patent and Trademark Office*